(12) United States Patent
Suzuki et al.

(10) Patent No.: US 12,211,668 B2
(45) Date of Patent: Jan. 28, 2025

(54) CHARGED PARTICLE BEAM DEVICE

(71) Applicant: Hitachi High-Tech Corporation, Tokyo (JP)

(72) Inventors: Kohei Suzuki, Tokyo (JP); Shunsuke Mizutani, Tokyo (JP); Yuji Kasai, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 387 days.

(21) Appl. No.: 17/645,496

(22) Filed: Dec. 22, 2021

(65) Prior Publication Data

US 2022/0230845 A1    Jul. 21, 2022

(30) Foreign Application Priority Data

Jan. 21, 2021    (JP) .................................. 2021-007815

(51) Int. Cl.
*H01J 37/28* (2006.01)
*H01J 37/10* (2006.01)
(Continued)

(52) U.S. Cl.
CPC .............. *H01J 37/28* (2013.01); *H01J 37/10* (2013.01); *H01J 37/222* (2013.01);
(Continued)

(58) Field of Classification Search
CPC .......... H01J 37/28; H01J 37/10; H01J 37/222; H01J 37/244; H01J 2237/24475;
(Continued)

(56) References Cited

U.S. PATENT DOCUMENTS

| 5,939,720 | A | 8/1999 | Todokoro | |
|---|---|---|---|---|
| 2002/0011565 | A1* | 1/2002 | Drexel | .................. H01J 37/244 250/397 |

(Continued)

FOREIGN PATENT DOCUMENTS

| JP | 10-294074 A | 11/1998 |
|---|---|---|
| JP | 5965819 B2 | 8/2016 |

(Continued)

OTHER PUBLICATIONS

Korean-language Office Action issued in Korean Application No. 10-2021-0178327 dated Sep. 27, 2023 (4 pages).

*Primary Examiner* — David A Vanore
(74) *Attorney, Agent, or Firm* — Crowell & Moring LLP (57) ABSTRACT

Provided is a charged particle beam device capable of detecting signal charged particles in a wide range of elevation angles from a large elevation angle to a small elevation angle and distinguishing detection signals between backscattered charged particles and secondary charged particles regardless of distribution of the signal charged particles. The charged particle beam device according to the disclosure includes a first detector that detects the secondary charged particles or the backscattered charged particles and a second detector that detects tertiary charged particles generated from the first detector, and generates an observation image of a sample using a signal value obtained by subtracting at least a part of a second detection signal output by the second detector from a first detection signal output by the first detector, or subtracting at least a part of the first detection signal from the second detection signal.

16 Claims, 9 Drawing Sheets

(51) Int. Cl.
*H01J 37/22* (2006.01)
*H01J 37/244* (2006.01)

(52) U.S. Cl.
CPC ... *H01J 37/244* (2013.01); *H01J 2237/24475* (2013.01); *H01J 2237/2448* (2013.01)

(58) Field of Classification Search
CPC ..... H01J 2237/2448; H01J 2237/24495; H01J 2237/281; H01J 37/22
See application file for complete search history.

(56) References Cited

U.S. PATENT DOCUMENTS

| | | | | |
|---|---|---|---|---|
| 2006/0289748 | A1* | 12/2006 | Schon | H01J 43/22 250/306 |
| 2009/0256076 | A1* | 10/2009 | Fukuda | H01J 37/145 250/311 |
| 2010/0243888 | A1* | 9/2010 | Nishiyama | H01J 37/20 250/306 |
| 2010/0294931 | A1* | 11/2010 | Zarchin | H01J 37/244 250/306 |
| 2012/0280126 | A1* | 11/2012 | Fukuda | H01J 37/145 250/310 |
| 2012/0298864 | A1 | 11/2012 | Morishita et al. | |
| 2013/0001420 | A1* | 1/2013 | Nomaguchi | H01J 37/3005 250/310 |
| 2013/0292568 | A1* | 11/2013 | Bizen | H01J 37/244 250/311 |
| 2014/0326879 | A1* | 11/2014 | Fukuda | H01J 37/145 250/310 |
| 2015/0014531 | A1* | 1/2015 | Yamazaki | H01J 37/244 250/311 |
| 2015/0287569 | A1 | 10/2015 | Yamamoto et al. | |
| 2016/0379795 | A1* | 12/2016 | Watanabe | H01J 37/28 250/310 |
| 2016/0379798 | A1* | 12/2016 | Shishido | G01B 15/04 250/307 |
| 2017/0263415 | A1* | 9/2017 | Bizen | H01J 37/244 |
| 2017/0301513 | A1* | 10/2017 | Osaki | H01J 37/28 |
| 2017/0345613 | A1* | 11/2017 | Mizuhara | H01J 37/12 |
| 2018/0025888 | A1* | 1/2018 | Shichi | H01J 37/241 250/307 |
| 2019/0074159 | A1* | 3/2019 | Takahashi | H01J 37/28 |
| 2019/0385810 | A1 | 12/2019 | Sato et al. | |
| 2020/0132448 | A1* | 4/2020 | Sato | H01J 37/222 |
| 2020/0234916 | A1* | 7/2020 | Yasui | H01J 37/265 |
| 2020/0363350 | A1* | 11/2020 | Irie | G03F 7/70625 |
| 2021/0313140 | A1* | 10/2021 | Bizen | H01J 37/222 |
| 2022/0230845 | A1* | 7/2022 | Suzuki | H01J 37/10 |

FOREIGN PATENT DOCUMENTS

| | | |
|---|---|---|
| JP | 6736756 B2 | 8/2020 |
| KR | 10-1998-0081497 A | 11/1998 |
| WO | WO 2011/089955 A1 | 7/2011 |
| WO | WO 2020/095346 A1 | 5/2020 |

* cited by examiner

CHARGED PARTICLE BEAM DEVICE

TECHNICAL FIELD

The present disclosure relates to a charged particle beam device.

BACKGROUND ART

A scanning electron microscope is one of charged particle beam devices. In the scanning electron microscope, an electron beam emitted from an electron source toward a sample is deflected by a scanning coil for two-dimensionally scanning the sample, and is further focused on the sample by an objective lens. At a radiation position, secondary electrons and backscattered electrons are generated as signal electrons from the sample. The generated signal electrons are detected by a detector, and collected information on the signal electrons is mapped in synchronization with a scanning position to obtain an observation image of the sample.

Generally, the secondary electrons and the backscattered electrons are substantially distinguished with reference to energy emitted from the sample. Secondary charged particles having energy of 50 eV or less are referred to as the secondary electrons, while secondary charged particles having energy of 50 eV or more are referred to as the backscattered electrons. It is known that each type of the signal electrons have different information on the sample since these signal electrons have different generation principles.

In a three-dimensional measurement of a deep hole structure or a deep trench structure on a surface of the sample, information on the sample is obtained from signal electrons generated at a bottom surface or an edge portion. Among the signal electrons, information on the bottom surface and depth is obtained from the backscattered electrons. This is because the backscattered electrons have an angular characteristic of being emitted in a specular reflection direction with respect to an angle at which a primary electron beam is incident on the sample. Information on the edge portion is obtained from the secondary electrons.

In order to obtain information on a depth direction, it is necessary to selectively acquire signals of the backscattered electrons, and measurement accuracy deteriorates when the secondary electrons are mixed. Therefore, an improvement in accuracy of the three-dimensional measurement is linked to discriminating the backscattered electrons from among detected signal electrons with high accuracy by an energy difference between the backscattered electrons and the secondary electrons.

Patent Literature 1 discloses a method for efficiently detecting secondary electrons and backscattered electrons from a sample using a plurality of detectors. In this method, signal electrons from the sample are directly detected by a first detector provided with a thin metal film on a detection surface. The first detector includes a scintillator detector. Further, tertiary electrons generated on the detection surface of the first detector are detected by a second detector. By taking a sum of detection signals of all the detectors, highly efficient detection is implemented.

Patent Literature 1 further discloses a method for distinguishing the secondary electrons from the backscattered electrons, in which the first detector is taken as a backscattered electron detector while the second detector is taken as a secondary electron detector. In this literature, an energy region where the tertiary electrons are generated with high efficiency on the detection surface of the first detector has about 1 kV of energy, and an energy region where a scintillator emits light with high efficiency has several kV of energy.

Patent Literature 2 discloses a method for acquiring an image by discriminating energy of signal electrons using a plurality of detectors. In this method, the plurality of detectors are disposed at the same solid angle, each detector detects the same number of signal electrons, and energy discrimination is performed using a difference in energy sensitivity between the detectors. The difference in energy sensitivity can be caused by changing a thickness of a thin film provided on a detection surface of a detector, and an image after energy discrimination is obtained by taking a difference between detection signals of the detectors.

Patent Literature 3 discloses a method in which backscattered electrons passed through an aperture for passing a primary electron beam are deflected toward a detector by a deflector, and secondary electrons are removed by an energy filter installed in front of the detector to selectively detect the backscattered electrons. When the primary electron beam is perpendicularly incident on a sample, an angle between a direction of signal electrons generated from the sample and a sample surface is defined as an elevation angle. That is, the elevation angle of the signal electron specularly reflected with respect to the primary electron beam is 90°. In the method of Patent Literature 3, since the backscattered electrons passed through the aperture for passing the primary electron beam are detected, the backscattered electrons having an elevation angle of around 90° are detected.

Patent Literature 4 describes a configuration that can detect backscattered electrons in a wide range of elevation angles by a detector used for the backscattered electrons disposed between an objective lens and a sample.

CITATION LIST

Patent Literature

PTL 1: JP-A-10-294074
PTL 2: WO2011/089955
PTL 3: WO2020/095346
PTL 4: Japanese Patent No. 5965819

SUMMARY OF INVENTION

Technical Problem

In the discrimination method disclosed in Patent Literature 1, a threshold value of energy of electrons that can be transmitted is determined by a thickness of a metal film. Accordingly, distinguishing is implemented only under a condition that energy of the secondary electrons is lower than the threshold value while energy of the backscattered electrons is higher than the threshold value. Therefore, in order to perform distinguishing, conditions such as energy of the primary electron beam and a voltage of an electrode used for electro-optical control cannot be set at will.

In the method disclosed in Patent Literature 2, the energy discrimination is performed by detecting only signal electrons having energy for transmitting the metal film as in Patent Literature 1 and performing difference calculation on signals from all the detectors. This method is on a premise that number distribution of the signal electrons is axisymmetric with respect to the primary electron beam, and the same number of signal electrons are always required to reach the plurality of detectors. However, actual signal electrons may show non-axisymmetric distribution with respect to a trajectory of the primary electron beam. In such a case, it is difficult to implement energy discrimination with high accuracy using a technique of this literature.

In the three-dimensional measurement, the backscattered electrons obtained by perpendicularly reflecting the primary electron beam at a bottom surface are distributed with an elevation angle of around 90°, and thus detection of the signal electrons around 90° is important. On the other hand, a range of elevation angles required for the measurement varies according to an aspect ratio of the structure, and detection in a wider range of elevation angles is required for a structure having a lower aspect ratio. The configuration in Patent Literature 3 can only detect the backscattered electrons at the elevation angle of around 90°, and is difficult to measure a structure having a low aspect ratio.

Patent Literature 3 further describes a configuration in which the energy filter is placed in front of the detector to remove the secondary electrons and detect only the backscattered electrons. In order to obtain a secondary electron image and a backscattered electron image by this detection method, images are needed to be acquired in a state in which the energy filter is on and a state in which the energy filter is off, and it takes time to acquire the images.

In the configuration of Patent Literature 4, although backscattered electrons in a wide range of elevation angles can be detected, backscattered electrons in an elevation angle of around 90° cannot be detected.

The disclosure is made in view of the above problems in the related art, and an objective of the disclosure is to provide a charged particle beam device capable of detecting signal charged particles in a wide range of elevation angles from a large elevation angle to a small elevation angle and distinguishing detection signals of the signal charged particles between backscattered charged particles and secondary charged particles regardless of distribution of the signal charged particles.

Solution to Problem

The charged particle beam device according to the disclosure includes a first detector that detects the secondary charged particles or the backscattered charged particles and a second detector that detects tertiary charged particles generated from the first detector, and generates an observation image of a sample using a signal value obtained by subtracting at least a part of a second detection signal output by the second detector from a first detection signal output by the first detector, or subtracting at least a part of the first detection signal from the second detection signal.

Advantageous Effect

According to the charged particle beam device of the disclosure, the signal charged particles in a wide range of elevation angles can be detected, and the detection signals can be distinguished between the backscattered charged particles and the secondary charged particles regardless of the distribution of the signal charged particles.

DESCRIPTION OF EMBODIMENTS

Problems in Related Art

Hereinafter, a problem in a charged particle beam device in the related art will be described first, and then a charged particle beam device according to the disclosure will be described.

Figure 1:
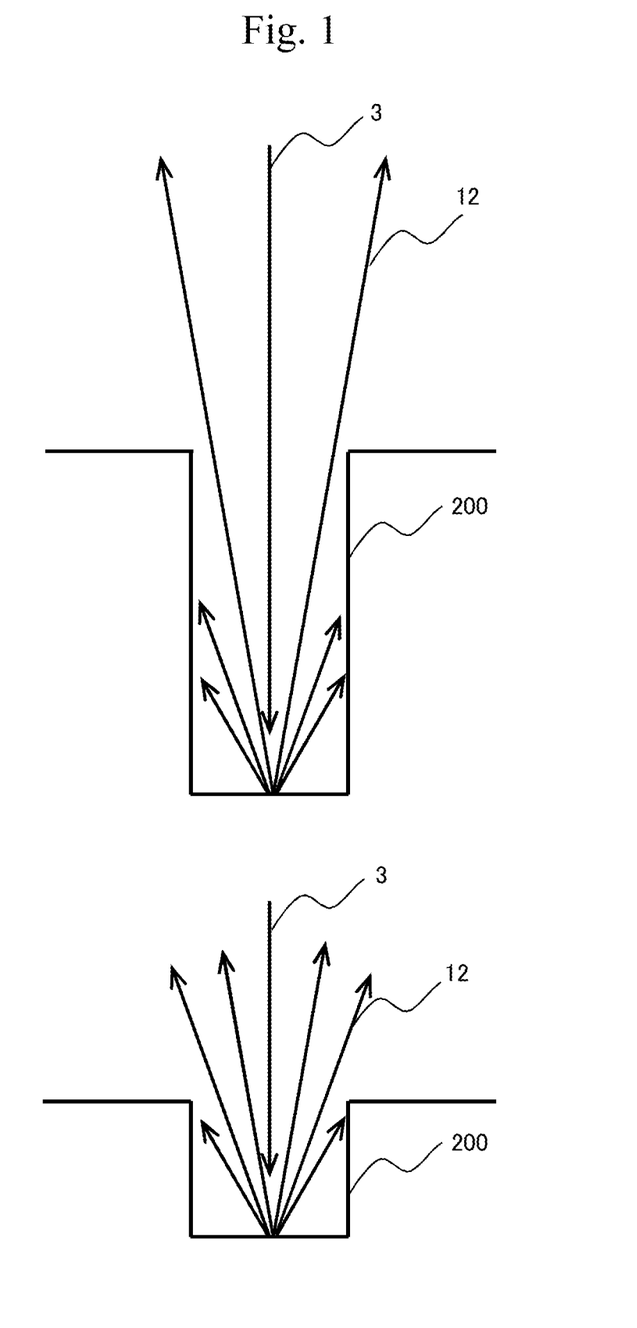
FIG. 1 is a schematic diagram of trajectories of signal electrons 12 when a primary electron beam 3 is radiated onto a bottom surface of a sample recess 200.

FIG. 1 is a schematic diagram of trajectories of signal electrons 12 when a primary electron beam 3 is radiated onto a bottom surface of a sample recess 200. In a case of a structure with a high aspect ratio, elevation angles of the signal electrons 12 emitted to an outside of a sample is limited to around 90°. On the other hand, in a case of a structure with a low aspect ratio, the signal electrons 12 are emitted in a wider range of elevation angles. Therefore, in order to accurately measure the structure with a low aspect ratio, it is necessary to detect signal electrons in a wide range of elevation angles.

Figure 2:
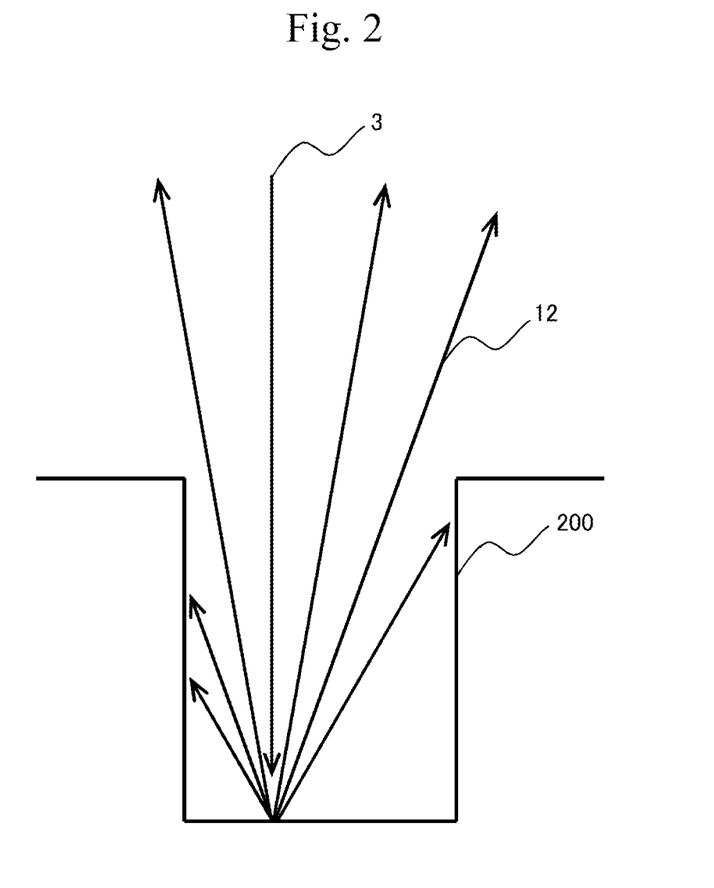
FIG. 2 is a schematic diagram showing a state in which the signal electrons collide with inner walls of a sample.

FIG. 2 is a schematic diagram showing a state in which the signal electrons collide with inner walls of the sample. As shown in FIG. 2, when the primary electron beam 3 is radiated onto the bottom surface of the sample recess 200, a part of the signal electrons 12 collide with the inner walls of the sample and are not emitted to the outside of the sample. As a result, the signal electrons 12 show non-axisymmetric distribution with respect to a trajectory of the primary electron beam. When the signal electrons 12 are distributed in this manner, a difference in the number of detected signal electrons occurs among a plurality of detectors, and energy discrimination cannot be performed by the difference between the detectors.

First Embodiment

Figure 3:
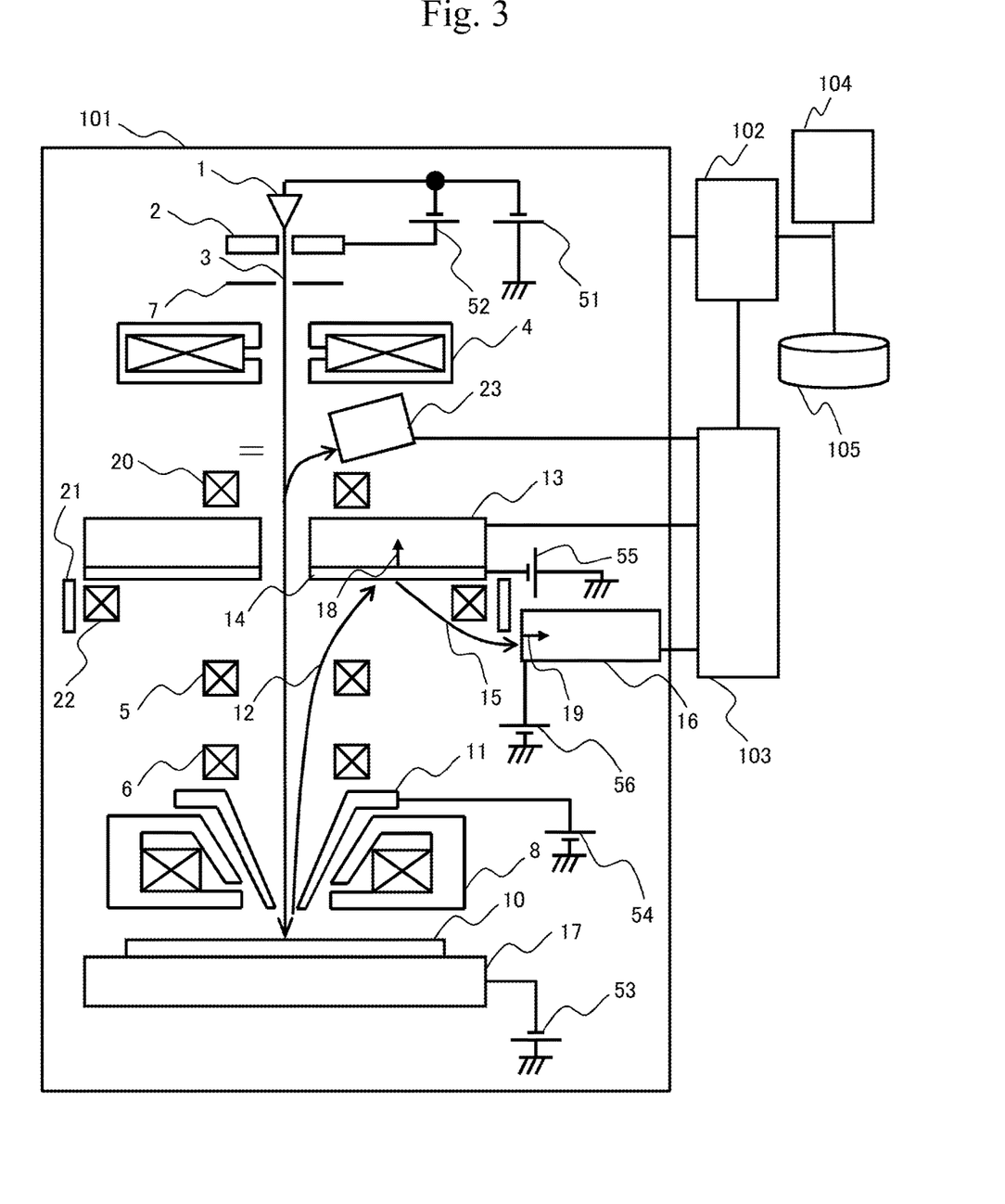
FIG. 3 is a configuration diagram of a scanning electron microscope 101 according to a first embodiment.

FIG. 3 is a configuration diagram of a scanning electron microscope 101 according to the first embodiment of the present disclosure. A cathode voltage 51 is applied to an electric field emission cathode 1, and an extracting voltage 52 is applied to an extraction electrode 2. As a result, an extraction electric field is formed, and a primary electron beam 3 is generated.

The primary electron beam 3 is focused by a condenser lens 4, and is deflected by an upper scanning deflector 5 and a lower scanning deflector 6 to two-dimensionally scan a sample 10. In order to control an intensity and an aperture angle of the primary electron beam 3, an objective aperture 7 is placed between the extraction electrode 2 and the condenser lens 4.

The primary electron beam 3 after deflection is further accelerated by a post-stage acceleration cylinder 11 to which a post-stage acceleration voltage 54 provided in a circuit of an objective lens 8 is applied, and is focused on the sample by the objective lens 8.

The signal electrons 12 such as secondary electrons and backscattered electrons are generated from a radiation position of the primary electron beam 3 on the sample 10. The signal electrons 12 are accelerated by an electric field between a negative retarding voltage 53 applied to a sample stage 17 and the post-stage acceleration cylinder 11.

The signal electrons 12 collide with a reflection plate 14 formed on a surface of a first detector 13. A part of the electrons collided with the reflection plate 14 are converted into tertiary electrons 15, and electrons transmitting the reflection plate 14 are converted into first light 18 by a conversion element (scintillator) in the first detector 13. The first light is taken into a photomultiplier tube and detected as an electric signal.

The tertiary electrons 15 are guided to a second detector 16 and are similarly converted into second light 19 by a conversion element (scintillator). The second light 19 is then detected as an electric signal by a photomultiplier tube. At this time, by applying a voltage 55 to a detection surface of the first detector 13, the generated tertiary electrons 15 can be accelerated and detection efficiency of the second detector 16 can be improved. By applying a voltage 56 to a detection surface of the second detector 16, the tertiary electrons 15 can be accelerated, and detection efficiency of the second detector 16 can be improved.

A deflection electrode 21 applies an electric field orthogonal to an axis of the primary electron beam 3. A deflection coil 22 applies a magnetic field orthogonal to the axis of the primary electron beam 3 and the electric field. As a result, the detection efficiency can be improved by deflecting the tertiary electrons 15 in a direction of the second detector 16. In addition, deflection of the primary electron beam 3 by the magnetic field can be cancelled, and straightness of the primary electron beam 3 can be maintained.

Regarding to a size of the detection surface of the first detector 13, it is desirable to widen the detection surface in order to detect the signal electrons 12 in a wide range of elevation angles.

Hereinafter, a procedure for obtaining an observation image of the sample will be described. By inputting necessary information from an input and output unit 104, an operation program is generated and stored in a storage unit 105. In accordance with the stored operation program, an overall control unit 102 and a signal processing unit 103 are controlled.

The overall control unit 102 operates the scanning electron microscope 101 and the signal processing unit 103 in accordance with control conditions according to the operation program.

A first output signal output from the first detector 13 and a second output signal output from the second detector 16 are taken into the signal processing unit 103. The signal processing unit 103 obtains a backscattered electron signal by calculating the first output signal and the second output signal. An equation for subtracting the second output signal from the first output signal is represented as a synthesis equation. This synthesis equation is determined based on first conversion efficiency (sensitivity $\alpha 1$) indicating efficiency with which the conversion element of the first detector 13 converts the secondary electrons into a part of the first light 18, second conversion efficiency (sensitivity $\beta 1$) with which the backscattered electrons is similarly converted into the first light 18, and third conversion efficiency (sensitivity $\alpha 2$) and fourth conversion efficiency (sensitivity $\beta 2$) with which the secondary electrons and the backscattered electrons are similarly converted into the second light 19 by the conversion element of the second detector 16.

When a detection signal of the first detector 13 is X1 and a detection signal of the second detector 16 is X2, the synthesis equation is shown as an Equation 1 as follows. The sensitivities $\alpha 1$, $\beta 1$, $\alpha 2$, and $\beta 2$ are determined by voltage values of the cathode voltage 51, the extracting voltage 52, the retarding voltage 53, the voltage 55 applied to the detection surface of the first detector, and the voltage 56 applied to the detection surface of the second detector, and material characteristics of the reflection plate 14. Therefore, synthesis ratios under these voltage conditions are stored in the storage unit 105 in advance, and are determined based on the operation program. When an image of the secondary electrons is obtained, an Equation 2 as follows may be used. A value obtained by the synthesis equation can be output from the overall control unit 102 to the input and output unit 104.

BACKSCATTERED ELECTRON SIGNAL=$-\alpha 2/(\alpha 1\beta 2-\alpha 2\beta 1)X1+\alpha 1/(\alpha 1\beta 2-\alpha 2\beta 1)X2$   Equation 1

SECONDARY ELECTRON SIGNAL=$\beta 2/(\alpha 1\beta 2-\alpha 2\beta 1)X1-\beta 1/(\alpha 1\beta 2-\alpha 2\beta 1)X2$   Equation 2

Figure 4:
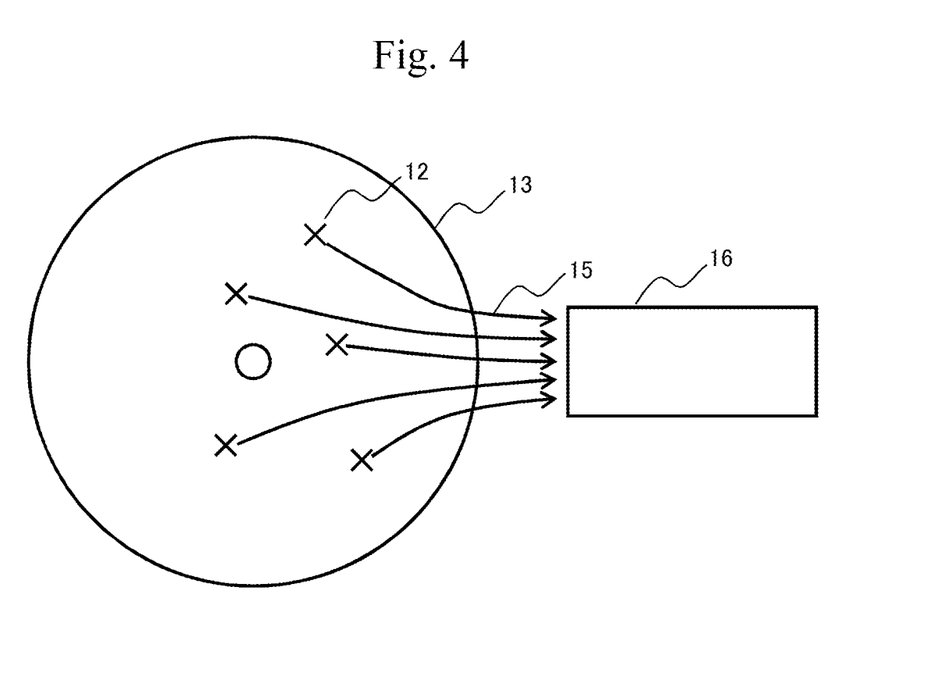
FIG. 4 is a schematic plan view showing a state in which a first detector 13 and a second detector 16 detect the signal electrons 12.

FIG. 4 is a schematic plan view showing a state in which the first detector 13 and the second detector 16 detect the signal electrons 12. The detection surface of the first detector 13 is the reflection plate 14. Cross marks indicate collision positions of the signal electrons 12. In measurement of a recess having a three-dimensional shape, as shown in FIG. 4, it is considered that the signal electrons 12 are non-asymmetrically distributed with respect to the primary electron beam 3.

In a configuration of the detector shown in FIG. 4, it can be considered that one signal electron 12 is detected by the first detector 13 and the second detector 16. Therefore, when the number of signal electrons detected by the first detector and the number of signal electrons detected by the second detector are added up, it can be considered that the same number of signal electrons are incident on the detectors regardless of distribution of the signal electrons. As a result, backscattered electron signals (or secondary electron signals) can be obtained even when the signal electrons 12 are non-asymmetrically distributed.

When an image of backscattered electrons emitted at an elevation angle of around 90° is required in measurement of a structure with a high aspect ratio, signal electrons passed through an aperture hole of the first detector 13 are deflected by a Wien filter deflector 20, and an upper detector 23 detects the resultant backscattered electrons. By adding up the backscattered electrons output from the upper detector 23 according to Equation 1, an image of the backscattered electrons emitted at an elevation angle of around 90° can be obtained.

Figure 5:
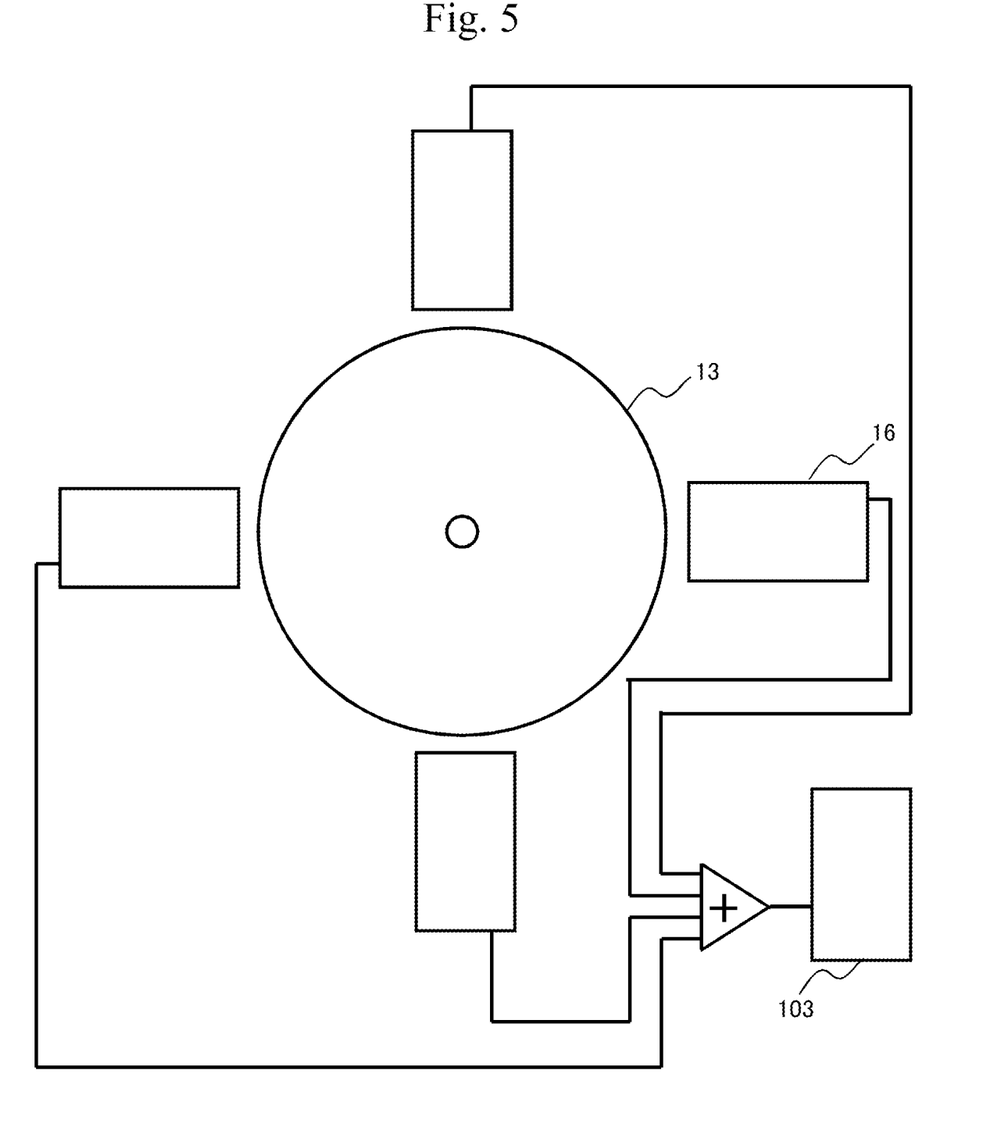
FIG. 5 is a plan view showing a configuration example in which a plurality of second detectors 16 are disposed along an outer periphery of the first detector 13.

FIG. 5 is a plan view showing a configuration example in which a plurality of second detectors 16 are disposed along an outer periphery of the first detector 13. When the detection surface of the first detector 13 is large, the tertiary electrons 15 that cannot be detected by only the second detector 16 disposed at one place are emitted. In this case, as shown in FIG. 5, the plurality of second detectors 16 may be disposed around the first detector 13, and detection signals of the second detectors 16 may be added up in the signal processing unit 103.

First Embodiment: Overview

The scanning electron microscope 101 according to the first embodiment includes the first detector 13 with the detection surface serving as the reflection plate, and the second detector 16 that detects tertiary charged particles generated from the reflection plate. As a result, signal charged particles that hit the reflection plate are detected by two detectors. Therefore, the number of the signal charged particles detected by each detector can be equaled. That is, the plurality of detectors detect the same number of signal charged particles regardless of distribution of the signal charged particles. Thus, energy discrimination can be implemented using a difference in detection signal intensity based on a difference in energy sensitivity between the detectors.

In the scanning electron microscope 101 according to the first embodiment, signal charged particles in a correspondingly wide range of elevation angles can be detected by enlarging the detection surface of the first detector 13 in a possible range. However, it is necessary to dispose the detectors such that no difference occurs in the number of charged particles detected by the first detector 13 and the second detector 16. When there is a concern that a signal may not be received by the second detector, a plurality of detectors are disposed around the reflection plate and the signals are added up, and thereby the signals can be regarded as the detection signals of the second detector 16.

In the scanning electron microscope 101 according to the first embodiment, the upper detector 23 detects backscattered electrons at large elevation angles. As a result, it is possible to detect signal charged particles in a wide range of elevation angles from a small elevation angle to a large elevation angle of around 90°.

Second Embodiment

Figure 6:
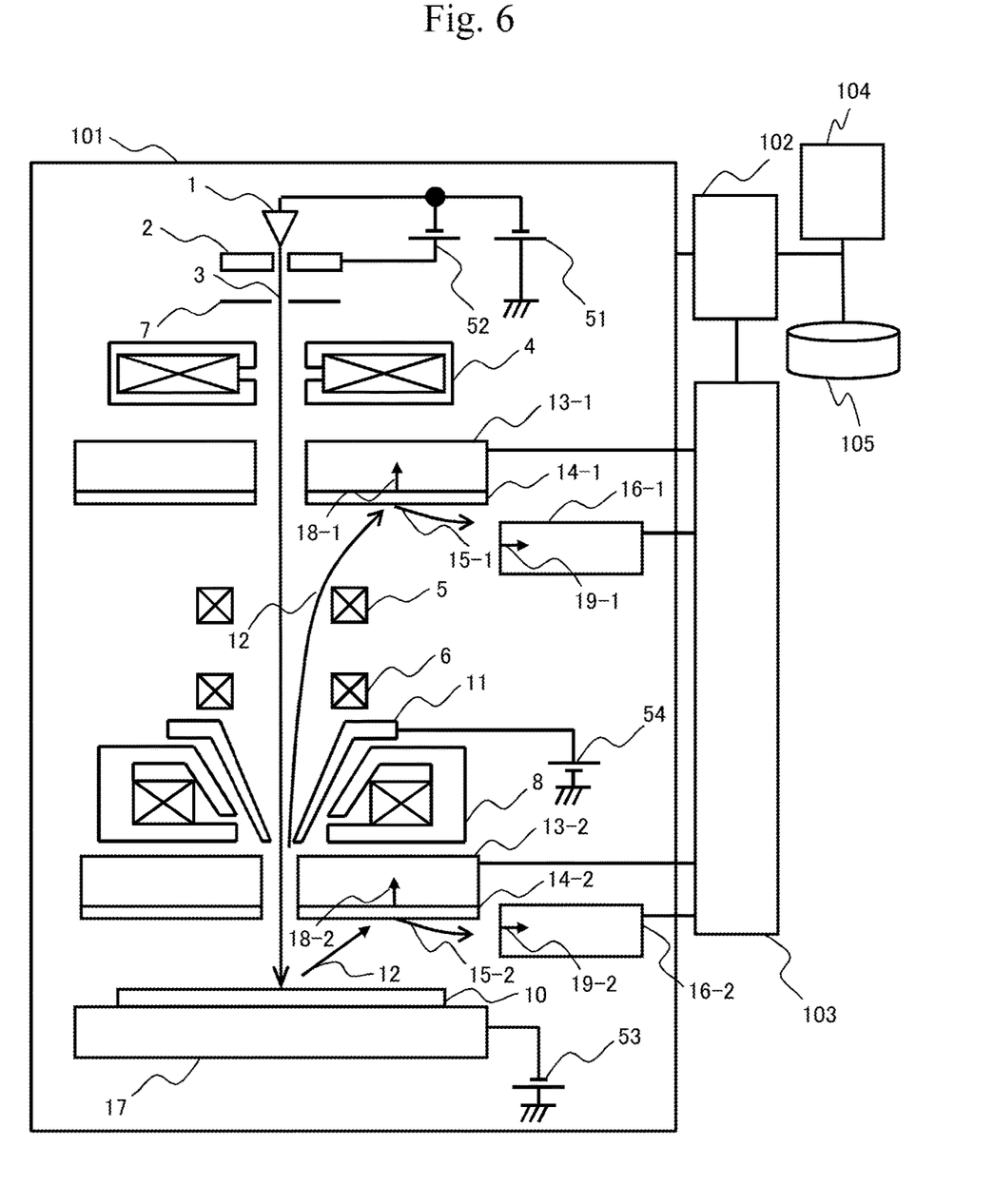
FIG. 6 is a configuration diagram of the scanning electron microscope 101 according to a second embodiment.

FIG. 6 is a configuration diagram of the scanning electron microscope 101 according to the second embodiment. In the second embodiment, in addition to the configuration described in the first embodiment, a first detector 13-2 and a second detector 16-2 are also disposed between the objective lens 8 and the sample 10. The first detector 13 and the second detector 16 in the first embodiment are denoted as a first detector 13-1 and a second detector 16-1 (corresponding to a "third detector" and a "fourth detector" in the claims) respectively, and are disposed at the same position as in the first embodiment or at a position closer to the electric field emission cathode 1 than in the first embodiment.

The first detector 13-2 and the second detector 16-2 mainly detect the signal electrons 12 at small elevation angles. The signal electrons 12 at large elevation angles are close to a trajectory of the primary electron beam 3 and pass through an inside of the objective lens 8, while the signal electrons 12 at small elevation angles collide with a lower surface of the objective lens 8 and structures around the lower surface.

Therefore, by disposing a detector below the objective lens 8, it is possible to detect the signal electrons 12 at small elevation angles.

Obtaining an image of backscattered electrons at small elevation angles is important for measuring a structure with a low aspect ratio. An observation image thereof can be obtained using backscattered electrons detected by the first detector 13-2 and the second detector 16-2.

The first detector 13-1 and the second detector 16-1 disposed at an upper portion can detect the signal electrons 12 at large elevation angles. Thus, the backscattered electrons and secondary electrons detected by these detectors can be distinguished and measured in each range of elevation angles, and these electrons can also be synthesized. In the present embodiment, since electrons at large elevation angles are detected by the first detector 13-1 and the second detector 16-1 instead of the upper detector 23, the upper detector 23 is not necessary.

Third Embodiment

Figure 7:
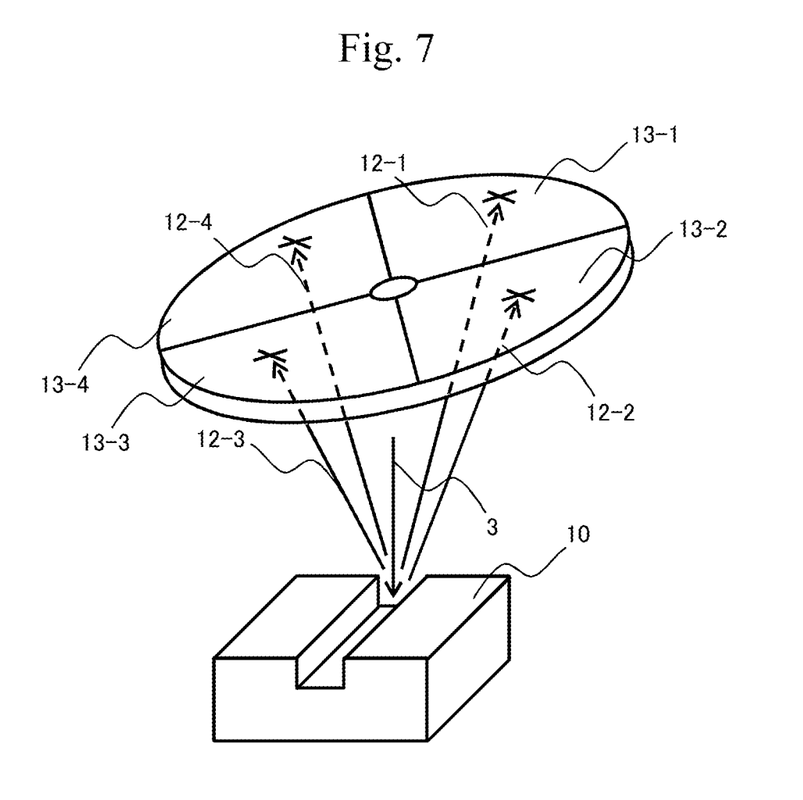
FIG. 7 is a schematic diagram showing a configuration of a detection system provided in the scanning electron microscope 101 according to a third embodiment.

FIG. 7 is a schematic diagram showing a configuration of a detection system provided in the scanning electron microscope 101 according to the third embodiment of the disclosure. In FIG. 7, the first detector 13 is divided into four detectors (13-1, 13-2, 13-3, 13-4). That is, the first detector 13 has four detection regions. In FIG. 7, when the sample 10 with a trench pattern is irradiated with the primary electron beam 3, signal electrons 12-1, 12-2, 12-3, and 12-4 are detected in the respective detection regions marked with a cross. Other configurations are the same as those of the first and second embodiments.

Figure 8:
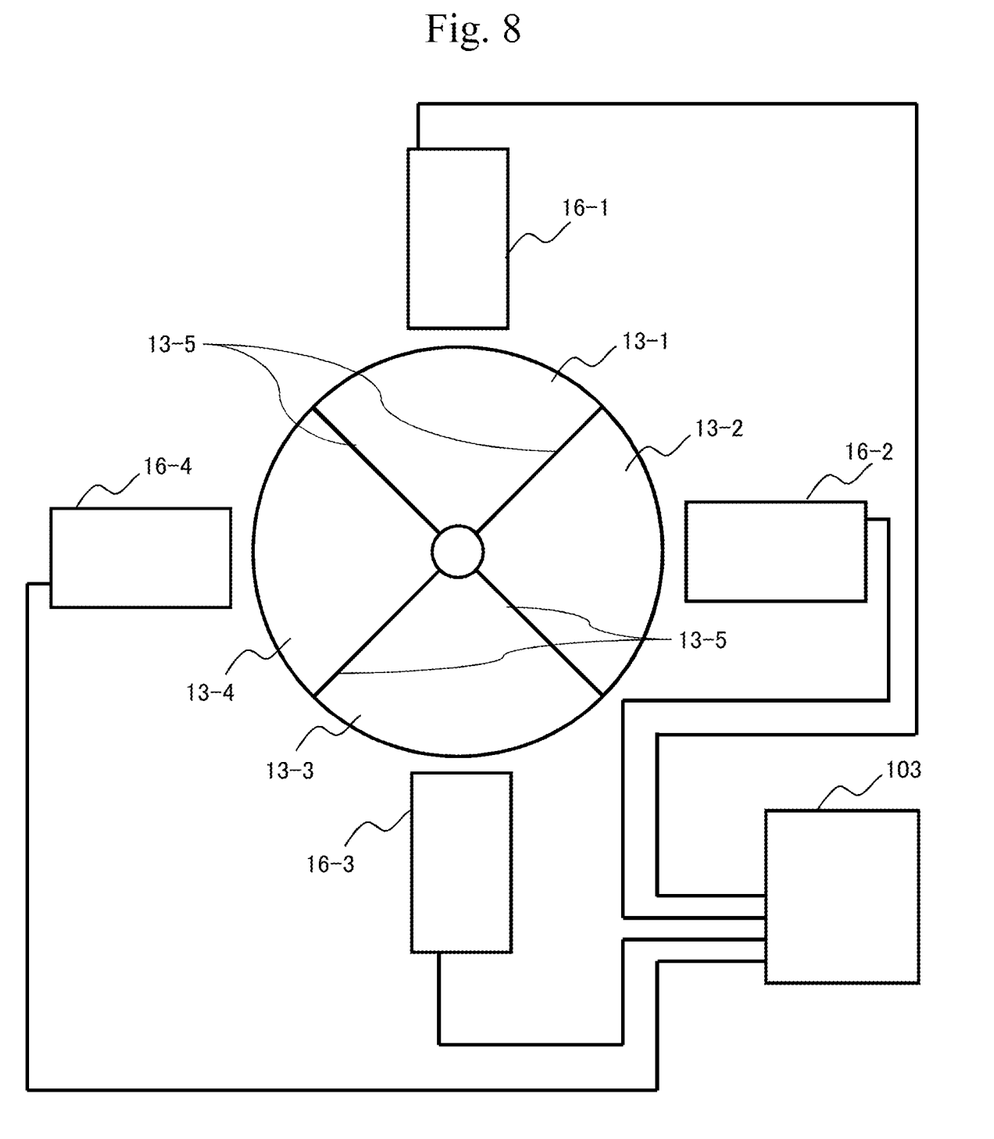
FIG. 8 is a plan view showing an arrangement of the second detectors 16 in the third embodiment.

FIG. 8 is a plan view showing an arrangement of the second detectors 16 in the third embodiment. In the present embodiment, the second detectors 16 (16-1, 16-2, 16-3, 16-4) are disposed for the respective four detection regions in the first detector 13. In the following description, it is assumed that the trench pattern extends along a longitudinal direction of FIG. 8.

By obtaining an image using signals of the first detectors 13-1 and 13-3 and the second detectors 16-1 and 16-3 in a direction parallel to the direction along which a trench extends, a ratio of a signal amount of backscattered electrons can be increased. On the other hand, since secondary electrons have low kinetic energy, a trajectory is bent under an influence of charging of the sample 10. Therefore, it is difficult for signal electrons generated at a bottom surface of the trench regardless of directions to reach the detectors. In a direction orthogonal to the trench, a part of the backscattered electrons are blocked by inner walls of the trench. As described above, by selectively acquiring signals of the detectors in the direction parallel to the trench and obtaining an image, detection efficiency with respect to the trench pattern is improved. When the trench pattern extends along a horizontal direction in FIG. 8, an image may be obtained in the same manner using signals of first detectors 13-2 and 13-4 and second detectors 16-2 and 16-4. It is not always necessary to use only the detectors along the trench pattern, and at least a signal weight of the detectors along the trench pattern may be larger than a signal weight of the detectors orthogonal to the trench pattern.

When the first detector 13 is divided into a plurality of detectors, the tertiary electrons 15 generated from the first detector 13 that are not originally assumed may be mixed into the second detector 16. For example, it is assumed that the second detector 16-1 detects the tertiary electrons 15 generated on a detection surface of the first detector 13-1, and the tertiary electrons 15 generated in the first detector 13-2 are considered to be mixed. In order to prevent such mixing, partitions 13-5 for blocking the tertiary electrons 15 may be provided on division surfaces (boundary portions between the detection regions) of the first detector 13. Alternatively, physical distances may be provided between the detectors so that the tertiary electrons 15 are not mixed.

Figure 9:
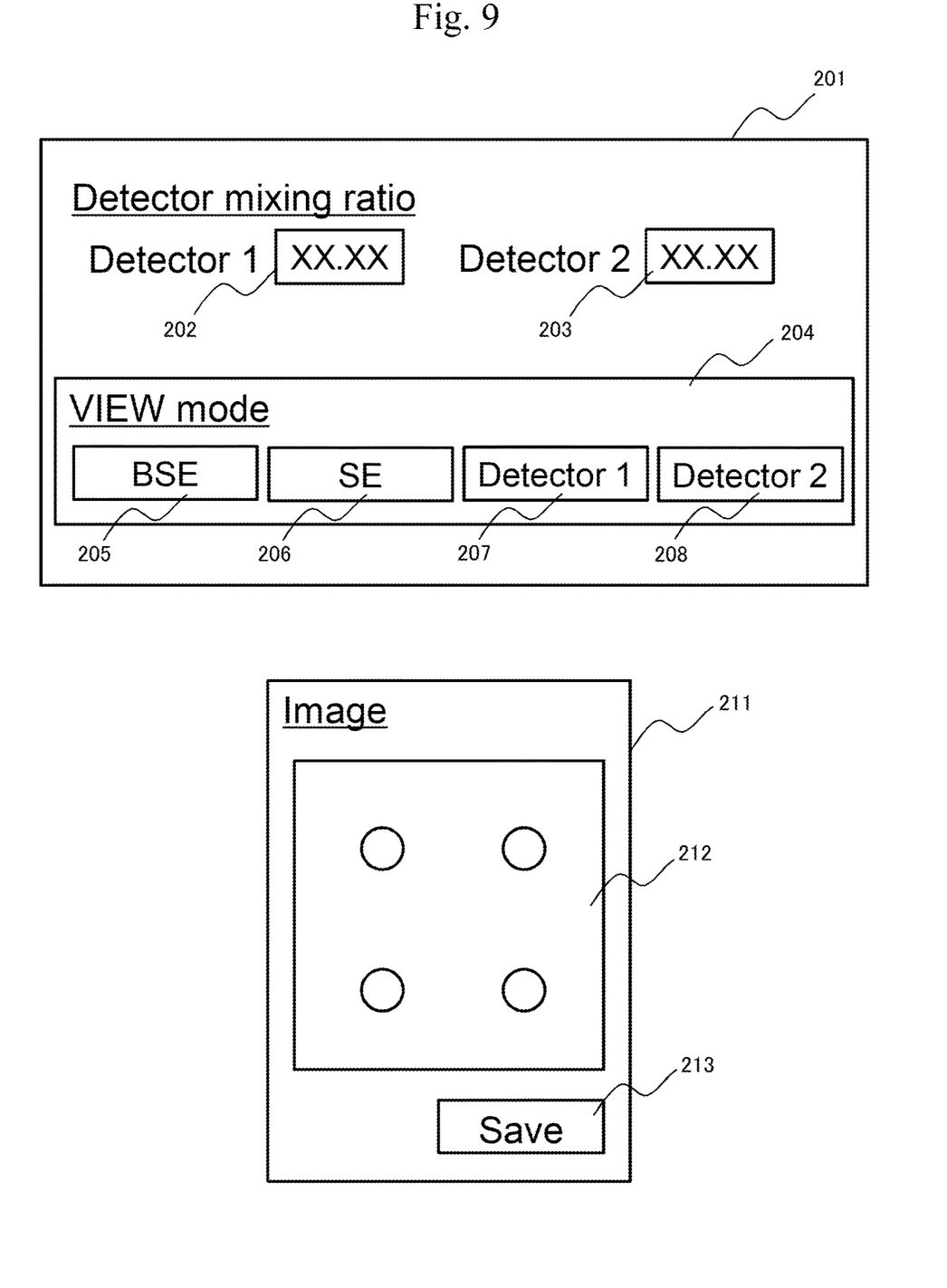
FIG. 9 shows an example of a screen of a user interface presented by the scanning electron microscope 101.

FIG. 9 shows an example of a screen of a user interface presented by the scanning electron microscope 101. The user interface can be presented on a display device such as a display included in the input and output unit 104.

In a signal selection screen 201, a user can specify coefficient values to be used in Equations 1 and 2. Further, the user can specify a calculation condition stored in advance. A coefficient value 202 of the first detector 13 and a coefficient value 203 of the second detector 16 are displayed. When a coefficient value is a negative value, it means that a subtraction processing is performed on a signal.

The coefficient value 202 corresponds to $-\alpha 2/(\alpha 1\beta 2-\alpha 2\beta 1)$ in Equation 1 or $\beta 2/(\alpha 1\beta 2-\alpha 2\beta 1)$ in Equation 2. An observation image can also be acquired based on specified values by directly inputting these values to the coefficient value 202. Similarly, the coefficient value 203 corresponds to $\alpha 1/(\alpha 1\beta 2-\alpha 2\beta 1)$ in Equation 1 or $\beta 1/(\alpha 1\beta 2-\alpha 2\beta 1)$ in Equation 2. An observation image can also be acquired based on specified values by directly inputting these values to the coefficient value 203.

A signal calculation condition selection box 204 includes a backscattered electron signal button 205, a secondary electron signal button 206, a first detector detection signal button 207, and a second detector detection signal button 208.

When the backscattered electron signal button 205 is pressed, coefficient values stored in advance in Equation 1 are automatically input to the coefficient values 202 and 203. Similarly, when the secondary electron signal button 206 is pressed, coefficient values stored in advance in Equation 2 are automatically input to the coefficient values 202 and 203.

When the first detector detection signal button 207 is pressed, 1 is input to the coefficient value 202 of a first detector detection signal while 0 is input to the coefficient value 203 of a second detector detection signal, so that only a detection signal of the first detector 13 is output. Similarly, only a detection signal of the second detector 16 is output when the second detector detection signal button 208 is pressed. Further, by manually inputting the coefficient value 202 of the first detector detection signal and the coefficient value 203 of the second detector detection signal, calculation can be performed by any synthesis equation.

A signal processed by a predetermined calculation method is displayed on an image unit 212 of a signal image display unit 211. When a save button 213 is pressed, image information can be saved in the storage unit 105. When the image is stored, position information on a sample of an image and environmental information such as conditions of an applied voltage to each electrode can also be acquired and stored.

<Modification of the Disclosure>

In the above embodiments, the signal processing unit 103 may also acquire a shape of a sample in a height direction (e.g., a depth of a trench pattern) using an observation image of the sample, and may present a result on the user interface.

In the third embodiment, the partitions 13-5 can be obtained by, for example, disposing members such as partition plates between the detection regions of the first detector 13, or by disposing materials different from that of the detectors at boundary portions between the detection regions. Alternatively, the partitions may be formed by other appropriate methods. That is, any partition member may be disposed between the detection regions to prevent signal electrons from being mixed.

In the embodiments described above, the overall control unit 102, the signal processing unit 103, and the input and output unit 104 can also be hardware such as a circuit device in which these functions are installed, or can be a calculation device that executes software in which these functions are installed. The overall control unit 102, the signal processing unit 103, and the input and output unit 104 can also be functional units of a computer system.

In the above embodiments, a scanning electron microscope is described as an example of a charged particle beam device in which an observation image of a sample is obtained by two-dimensionally scanning an electron beam of a probe converged on the sample, detecting secondary electrons and backscattered electrons generated from the sample, and mapping a signal amount for each scanning position. The invention can also be applied to other charged particle beam devices that obtain an observation image of a sample by irradiating the sample with a charged particle beam.

REFERENCE SIGN LIST 1 electric field emission cathode
2 extraction electrode
3 primary electron beam
4 condenser lens
5 upper scanning deflector
6 lower scanning deflector
7 objective aperture
8 objective lens
10 sample
11 post-stage acceleration cylinder
12 signal electron
13 first detector
14 reflection plate
15 tertiary electron
16 second detector
17 sample stage
18 first light
19 second light
20 Wien filter deflector
21 deflection electrode
22 deflection coil
23 upper detector
51 cathode voltage
52 extracting voltage
53 retarding voltage
54 post-stage acceleration voltage
55 voltage applied to detection surface of first detector
56 voltage applied to detection surface of second detector
101 scanning electron microscope
102 overall control unit
103 signal processor
104 input and output unit
105 storage unit

The invention claimed is:

1. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal,
the first detector is provided with an opening through which the charged particle beam passes,
the charged particle beam device further comprises:
an aperture that adjusts an aperture angle of the charged particle beam; and
a third detector that detects the backscattered charged particles passing through the opening and outputs a third detection signal showing an intensity of the backscattered charged particles, wherein
the third detector is disposed between the aperture and the first detector, and
the controller generates the observation image using the first detection signal, the second detection signal, and the third detection signal.

2. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal, and
the second detector is disposed at two or more locations surrounding the first detector in a plane orthogonal to a radiation direction of the charged particle beam.

3. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal; and
a power supply that accelerates the tertiary charged particles by applying a voltage to at least one of the detection surface of the first detector and a detection surface of the second detector.

4. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal, and
the first detector is disposed between the charged particle source and the objective lens.

5. The charged particle beam device according to claim 4, wherein
the controller calculates a signal amount of the backscattered charged particles by a first calculation equation $-\alpha_2/(\alpha_1\beta_2-\alpha_2\beta_1) X_1 + \alpha_1/(\alpha_1\beta_2-\alpha_2\beta_1) X_2$ using
sensitivity $\alpha_1$ with which the first detector detects the secondary charged particles, sensitivity β1 with which the first detector detects the backscattered charged particles,
sensitivity α2 with which the second detector detects the secondary charged particles,
sensitivity β2 with which the second detector detects the backscattered charged particles,
a signal intensity X1 of the first detection signal, and
a signal intensity X2 of the second detection signal.

6. The charged particle beam device according to claim 4, wherein
the controller calculates a signal amount of the secondary charged particles by a second calculation equation $\beta2/(\alpha1\beta2-\alpha2\beta1)X1-\beta1/(\alpha1\beta2-\alpha2\beta1)X2$ using
sensitivity α1 with which the first detector detects the secondary charged particles,
sensitivity β1 with which the first detector detects the backscattered charged particles,
sensitivity α2 with which the second detector detects the secondary charged particles,
sensitivity β2 with which the second detector detects the backscattered charged particles,
a signal intensity X1 of the first detection signal, and
a signal intensity X2 of the second detection signal.

7. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal;
an objective lens that focuses the charged particle beam on the sample; and
a stage on which the sample is placed, wherein
the first detector is disposed between the stage and the objective lens.

8. The charged particle beam device according to claim 1, further comprising:
an objective lens that focuses the charged particle beam on the sample; and
a stage on which the sample is placed, wherein
the first detector is disposed between the stage and the objective lens, and
the third detector is disposed between the objective lens and the aperture.

9. The charged particle beam device according to claim 8, further comprising:
a fourth detector that detects tertiary charged particles generated when the backscattered charged particles passing through the opening collide with a detection surface of the third detector, and outputs a fourth detection signal showing an intensity of the tertiary charged particles, wherein
the controller generates the observation image using the first detection signal, the second detection signal, the third detection signal, and the fourth detection signal.

10. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal,
the first detector has
a first detection region and a second detection region on a line extending in a first direction, and
a third detection region and a fourth detection region on a line extending in a second direction orthogonal to the first direction, wherein
when generating the observation image of a trench pattern extending on the sample along the first direction, the controller makes a weight of the first detection signal acquired in the first detection region and the second detection region larger than a weight of the first detection signal acquired in the third detection region and the fourth detection region, and
when generating the observation image of the trench pattern extending on the sample along the second direction, the controller makes the weight of the first detection signal acquired in the third detection region and the fourth detection region larger than the weight of the first detection signal acquired in the first detection region and the second detection region.

11. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal,
the first detector has a first detection region and a second detection region for detecting the secondary charged particles and the backscattered charged particles, and
the second detector is disposed corresponding to each of the first detection region and the second detection region,
the charged particle beam device further comprises:
a partition member that prevents the tertiary charged particle generated in the first detection region from being mixed into the second detector disposed corresponding to the second detection region, and prevents the tertiary charged particle generated in the second detection region from being mixed into the second detector disposed corresponding to the first detection region.

12. The charged particle beam device according to claim 5, further comprising:
a display screen that presents the observation image.

13. The charged particle beam device according to claim 12, wherein
the display screen is configured to display each of
the observation image generated using the secondary charged particles,
the observation image generated using the backscattered charged particles,
the observation image generated using charged particles detected by the first detector, and
the observation image generated using charged particles detected by the second detector.

14. The charged particle beam device according to claim 5, further comprising:
a display screen that presents the observation image, wherein
the display screen is further configured to specify a value of $-\alpha 2/(\alpha 1\beta 2-\alpha 2\beta 1)$ in the first calculation equation and a value of $+1/(\alpha 1\beta 2-\alpha 2\beta 1)$ in the first calculation equation, and
the controller calculates the signal amount of the backscattered charged particles using a value specified in the display screen.

15. The charged particle beam device according to claim 6, further comprising:
a display screen that presents the observation image, wherein
the display screen is further configured to specify a value of $\beta 2/(\alpha 1\beta 2-\alpha 2\beta 1)$ in the second calculation equation and a value of $-\beta 1/(\alpha 1\beta 2-\alpha 2\beta 1)$ in the second calculation equation, and
the controller calculates the signal amount of the secondary charged particles using a value specified in the display screen.

16. A charged particle beam device comprising:
a first detector that detects secondary charged particles and backscattered charged particles generated from a sample when the sample is irradiated with a charged particle beam, and outputs a first detection signal showing an intensity of the secondary charged particles and the backscattered charged particles;
a second detector that detects tertiary charged particles generated when the secondary charged particles or the backscattered charged particles collide with a detection surface of the first detector, and outputs a second detection signal showing an intensity of the tertiary charged particles;
a charged particle source that emits the charged particle beam;
an objective lens that focuses the charged particle beam on the sample; and
a computer, including a controller and a storage that stores a program for execution by the controller, the program causing the controller to:
receive the first detection signal and the second detection signal and generate an observation image of the sample using the first detection signal and the second detection signal,
wherein the controller is programmed to generate the observation image based on a signal value obtained by subtracting at least a part of the second detection signal from the first detection signal or subtracting at least a part of the first detection signal from the second detection signal, and
the controller acquires a shape of the sample in a height direction using the observation image.

* * * * *